United States Patent [19]
Sher

[11] Patent Number: 5,949,725
[45] Date of Patent: Sep. 7, 1999

[54] METHOD AND APPARATUS FOR REPROGRAMMING A SUPERVOLTAGE CIRCUIT

[75] Inventor: Joseph C. Sher, Boise, Id.

[73] Assignee: Micron Technology, Inc., Boise, Id.

[21] Appl. No.: 08/915,215

[22] Filed: Aug. 20, 1997

[51] Int. Cl.$^6$ ....................................... G11C 7/00
[52] U.S. Cl. ...................... 365/201; 365/189.09; 365/226
[58] Field of Search .................... 365/201, 207, 365/226, 205, 225.7, 185.23, 189.09; 371/28, 21.4; 324/763

[56] References Cited

U.S. PATENT DOCUMENTS

| | | | |
|---|---|---|---|
| 5,363,333 | 11/1994 | Tsujimoto | 365/201 |
| 5,448,199 | 9/1995 | Park | 327/546 |
| 5,463,585 | 10/1995 | Sanada | 365/201 |
| 5,550,778 | 8/1996 | Takahashi | 365/207 |
| 5,712,575 | 1/1998 | Ma et al. | 324/763 |
| 5,721,703 | 2/1998 | Habersetzer et al. | 365/185.23 |
| 5,745,499 | 4/1998 | Ong | 371/21.4 |
| 5,841,714 | 11/1998 | Sher et al. | 365/201 |

Primary Examiner—David Nelms
Assistant Examiner—Thong Le
Attorney, Agent, or Firm—Seed and Berry LLP

[57] ABSTRACT

In an integrated circuit including test circuitry for testing integrated circuit function, a programmable supervoltage circuit is described for enabling the test circuitry. The supervoltage circuit includes a reference circuit, a step-down circuit, a sensing circuit, and an output circuit. The reference circuit produces a reference voltage. The step-down circuit receives an input voltage and produces a stepped-down voltage. The sensing circuit is coupled with the reference and step-down circuits, receives the reference and stepped-down voltages, and produces a sense signal as a function of the relative values of the reference and stepped-down voltages. The output circuit is coupled with the sensing circuit, receives the sense signal, and produces a supervoltage output signal to enable the test circuitry. In a first embodiment, a programmable selection circuit is coupled with and selectively shunts one or more circuit elements in the step-down circuit to adjust the value of the stepped-down voltage relative to the input voltage. In a second embodiment, the selection circuit is coupled with and selectively shunts one or more circuit elements in the reference circuit to adjust the value of the reference voltage. In a third embodiment, the step-down circuit receives the input voltage at a selected one of a plurality of input terminals and produces a corresponding stepped-down voltage.

43 Claims, 6 Drawing Sheets

METHOD AND APPARATUS FOR REPROGRAMMING A SUPERVOLTAGE CIRCUIT

TECHNICAL FIELD

This invention relates generally to integrated circuits having test circuitry, and more particularly, to integrated circuits including a supervoltage circuit for enabling test circuitry.

BACKGROUND OF THE INVENTION

During manufacture of integrated circuits, a wide variety of operating characteristics and circuit functions are tested. Many integrated circuits include test circuitry which is enabled during testing operations and disabled during normal integrated circuit operations. For example, normal operations in a 1M×4 memory chip include reading and writing four data bits at a time. To improve testing efficiency, test circuitry may be integrated within the memory chip to test 64 data bits at a time. One way of enabling such test circuitry is to apply to an externally accessible terminal an elevated voltage not expected during normal memory chip operations (commonly known as a supervoltage). The memory chip includes a circuit known as a supervoltage circuit which detects the supervoltage and responsively enables the test circuitry.

Because integrated circuit fabrication involves a number of process steps, variations in circuit element parameters are commonplace. For example, significant variations in transistor threshold voltages can occur, which, if large enough, cause the integrated circuit to malfunction. Even variations that do not deleteriously affect intended integrated circuit function can nevertheless affect the testing of that integrated circuit function. In particular, high transistor threshold voltages can result in supervoltage magnitudes sufficient to cause transistor junction breakdown. This is especially true for those tests in which the semiconductor substrate is negatively biased.

SUMMARY OF THE INVENTION

In accordance with the principles of the present invention, an integrated circuit is provided which includes a primary circuit, a test circuit, and a test enable circuit. The test circuit is coupled with the primary circuit and tests primary circuit functions in response to an asserted test enable signal. The test enable circuit receives an input voltage and provides the test enable signal in response thereto. When the magnitude of the input voltage exceeds a trip point, the test enable circuit asserts the test enable signal. The test enable circuit is programmable to adjust the trip point. For example, after determining a threshold voltage characteristic of the integrated circuit and/or selecting one of a plurality of test procedures for testing primary circuit functions, the test enable circuit is programmed accordingly.

The test enable circuit may be a supervoltage circuit including a reference circuit, a step-down circuit, and a sensing circuit. The reference circuit produces a reference voltage. The step-down circuit receives the input voltage and produces a stepped-down voltage. The sensing circuit is coupled with the reference and step-down circuits and receives the reference and stepped-down voltages. The sensing circuit produces a sense signal as a function of the relative values of the reference and stepped-down voltages. In a first embodiment, the supervoltage circuit includes a programmable selection circuit coupled with the step-down circuit and adapted to receive a selection signal to responsively adjust the value of the stepped-down voltage relative to the input voltage. In a second embodiment, the selection circuit is coupled with the reference circuit and adjusts the value of the reference voltage. In a third embodiment, the step-down circuit receives the input voltage at one of a plurality of input terminals and produces a corresponding stepped-down voltage.

DETAILED DESCRIPTION OF THE INVENTION

In the following description, certain specific details are set forth in order to provide a thorough understanding of the embodiments of the present invention. However, one skilled in the art will understand that the present invention may be practiced without these details. In other instances, well-known circuits and structures have not been shown in detail in order not to unnecessarily obscure the description of the various embodiments of the invention.

Figure 1:
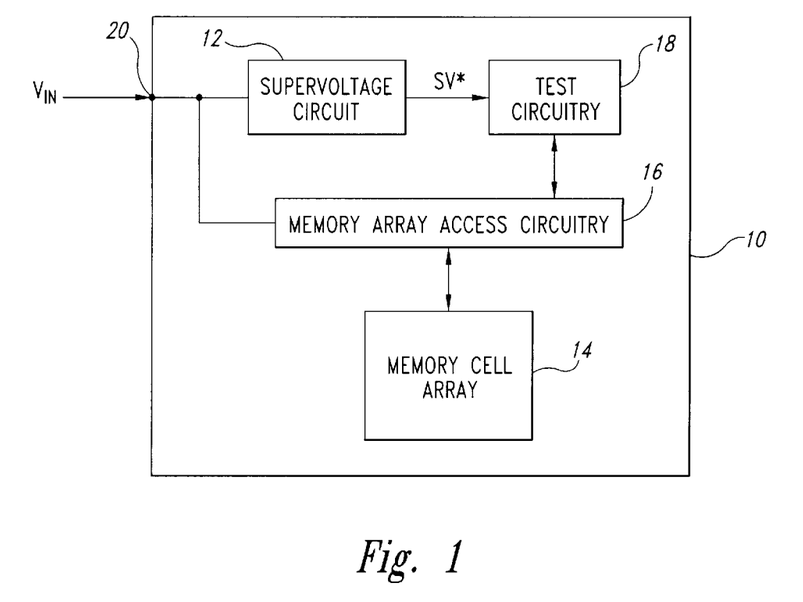
FIG. 1 is a functional block diagram which depicts a memory device having a supervoltage circuit in accordance with the present invention.

FIG. 1 is a functional block diagram which depicts an integrated circuit, such as a memory device 10, having a supervoltage circuit 12. The memory device 10 includes a memory cell array 14, for storing data, and memory array access circuitry 16, for reading data from and writing data to the memory cell array 14. The memory array access circuitry 16 includes circuitry such as row and column address decode circuitry, sense amplifier and I/O gating circuitry, and data input and output circuitry. The memory cell array 14 and the memory array access circuitry 16 together form a "primary" circuit—namely, the circuit which supports functions expected during normal operation of the memory device 10. Those skilled in the art will appreciate that the primary circuit can be any of a wide variety of integrated circuits where a test enable circuit, such as the supervoltage circuit 12, is used to enable testing of integrated circuit functions.

The memory device 10 also includes test circuitry 18 coupled with the memory array access circuitry 16. The test circuitry 18 is selectively enabled during testing of the memory device, but not otherwise used during normal operation of the memory device. The test circuitry 18 is enabled by an asserted supervoltage output signal SV* produced by the supervoltage circuit 12. The characteristic and function of the test circuitry 18 will depend upon the nature of the primary circuit. However, test circuitry for most varieties of primary circuits in widespread use are conventional. An input 20 of the memory device 10 is connected to the supervoltage circuit 12, as well as to the memory array access circuitry 16 for use during normal operation of the memory device. For example, the input 20 may be an address input of the memory device 10, and voltages applied thereto during normal operations of the memory device are of insufficient magnitude to cause the supervoltage circuit 12 to assert the output signal SV*. If, however, an input voltage $V_{IN}$ is applied to the input 20 of a magnitude greater than a trip voltage, the supervoltage circuit 12 will then assert the output signal SV*, thereby enabling the test circuitry 18.

In accordance with the present invention, and as described below in connection with various embodiments, the supervoltage circuit 12 has an adjustable trip point. Thus, the magnitude of the input voltage $V_{IN}$ required to assert the supervoltage output signal SV* can be varied, depending on threshold voltage characteristics of the memory device 10, as well as particular testing procedures which employ the functionality of the test circuitry 18.

Figure 2A:
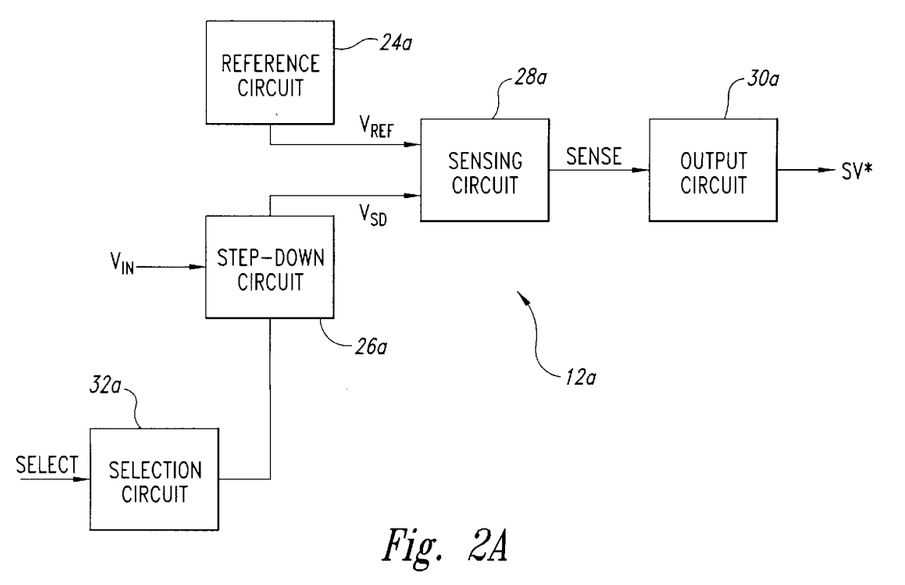
FIG. 2A is a functional block diagram which depicts a supervoltage circuit in accordance with a first embodiment of the present invention.

FIG. 2A depicts a first embodiment of the supervoltage circuit 12 of FIG. 1. A supervoltage circuit 12a includes a reference circuit 24a, a step-down circuit 26a, a sensing circuit 28a, an output circuit 30a, and a selection circuit 32a. The reference circuit 24a produces a reference voltage $V_{REF}$. The step-down circuit 26a receives the input voltage $V_{IN}$ and responsively produces a stepped-down voltage $V_{SD}$. The sensing circuit 28a is coupled with the reference circuit 24a and the step-down circuit 26a. The sensing circuit 28a receives the reference and stepped-down voltages and produces an output signal SENSE in response thereto. The SENSE signal has one or the other of two logic states, depending on the relative values of the reference voltage $V_{REF}$ and the stepped-down voltage $V_{SD}$. The output circuit 30a is coupled with the sensing circuit 28a to receive the SENSE signal. The output circuit 30a buffers the SENSE signal and produces the supervoltage output signal SV*, which has asserted and deasserted logic states, depending on the logic states of the SENSE signal.

The selection circuit 32a is coupled with the step-down circuit 26a. The selection circuit 32a adjusts the relative values of the stepped-down voltage $V_{SD}$ and the input voltage $V_{IN}$ in response to a selection input signal SELECT. The SELECT signal may be produced internal to the integrated circuit incorporating the supervoltage circuit 12a, or may be applied to the integrated circuit by an external source. By adjusting the relative values of the stepped-down and input voltages, the selection circuit 32a adjusts the magnitude of the input voltage $V_{IN}$ required to cause assertion of the supervoltage output signal SV*.

Figure 2B:
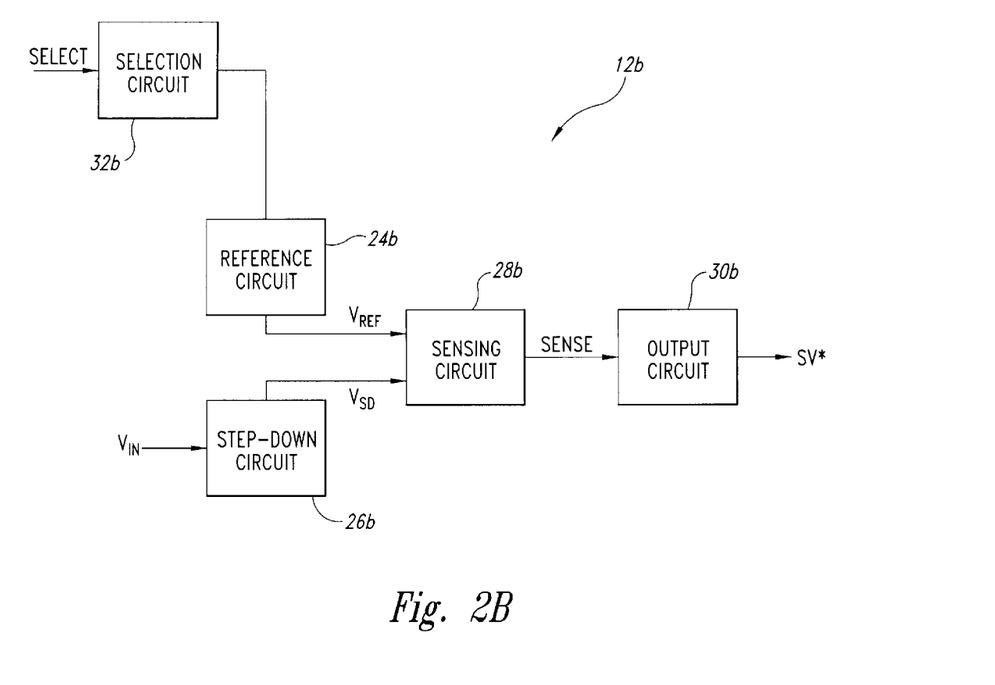
FIG. 2B is a functional block diagram which depicts a supervoltage circuit in accordance with a second embodiment of the present invention.

FIG. 2B depicts a second embodiment of the supervoltage circuit 12 of FIG. 1. A supervoltage circuit 12b includes a reference circuit 24b, a step-down circuit 26b, a sensing circuit 28b, an output circuit 30b, and a selection circuit 32b. As shown in FIG. 2B, the supervoltage circuit 12b is of similar configuration to the supervoltage circuit 12a shown in FIG. 2A. However, the supervoltage circuit 12b has the selection circuit 32b coupled with the reference circuit 24b to adjust the value of the reference voltage $V_{REF}$. Because the sensing circuit 28b responds to the relative values of the reference and stepped-down voltages, the magnitude of the stepped-down voltage $V_{SD}$ necessary to switch the SENSE signal from one to another logic state is correspondingly adjusted. Accordingly, the magnitude of the input voltage $V_{IN}$ required to cause assertion of the supervoltage output signal SV* is adjusted by operation of the selection circuit 32b.

Figure 2C:
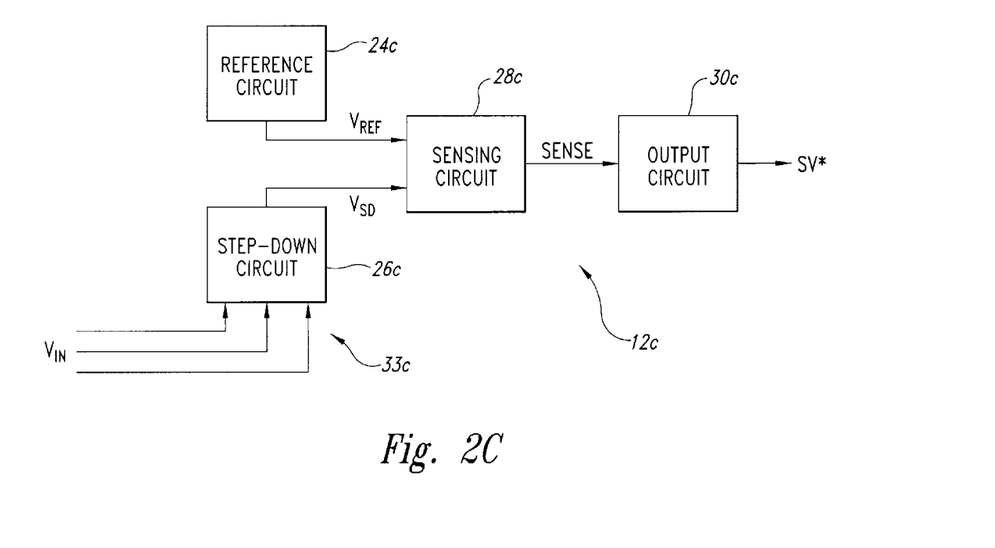
FIG. 2C is a functional block diagram which depicts a supervoltage circuit in accordance with a third embodiment of the present invention.

FIG. 2C depicts a third embodiment of the supervoltage circuit 12 shown in FIG. 1. A supervoltage circuit 12c includes a reference circuit 24c, a step-down circuit 26c, a sensing circuit 28c, and an output circuit 30c. The configuration shown in FIG. 2C is similar to those shown in FIGS. 2A and 2B, but does not include a circuit corresponding to the selection circuits 32a and 32b. Instead, the step-down circuit 26c includes a plurality of inputs 33c, to which the input voltage $V_{IN}$ is selectively applied. By selecting one of the inputs 33c, the required magnitude of the input voltage $V_{IN}$ to cause assertion of the supervoltage output signal SV* is correspondingly selected. The selection of one of the inputs 33c may be determined internal to the integrated circuit incorporating the supervoltage circuit 12c, or may be determined by external selection of a corresponding one of external electrical connections to the integrated circuit.

Figure 3A:
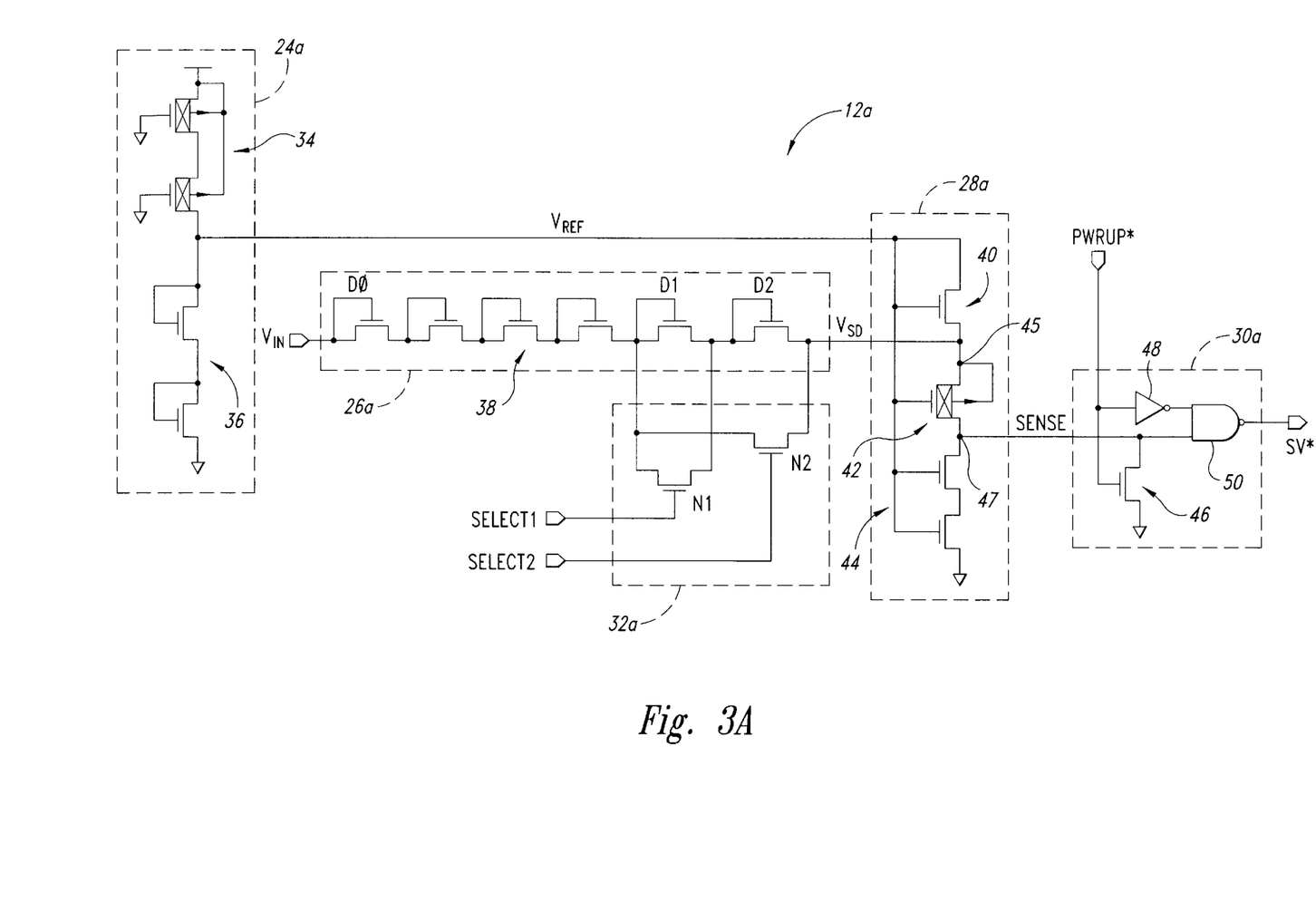
FIG. 3A is a schematic circuit diagram which depicts a preferred implementation of the supervoltage circuit shown in FIG. 2A.

FIG. 3A is a schematic diagram which depicts a preferred implementation of the supervoltage circuit 12a of FIG. 2A. The reference circuit 24a includes PMOS transistors 34 and NMOS transistors 36 connected in series between supply and ground potentials. The PMOS transistors 34 have their gates tied to ground potential and essentially function as resistors. Each of the NMOS transistors 36 is diode-configured—i.e., gate tied to drain—and essentially functions as a diode, providing a discrete, approximately constant voltage drop approximately equal to the threshold voltage of the transistor. The voltage drop across the NMOS transistors 36, collectively, provides the reference voltage $V_{REF}$.

The step-down circuit 26a includes a plurality of voltage drop elements, such as diode-configured NMOS transistors 38, for stepping down the input voltage $V_{IN}$ to produce the stepped-down voltage $V_{SD}$. Those skilled in the art will appreciate that any of a wide variety of voltage drop elements can be suitably employed for stepping down the input voltage. Examples include diode configured PMOS transistors, resistors, diodes, etc. Two of the NMOS transistors 38, i.e., D1 and D2, are coupled to the selection circuit 32a for the reasons explained below.

The sensing circuit 28a includes a diode-configured NMOS transistor 40, a PMOS transistor 42, and NMOS transistors 44 connected in series between the reference voltage $V_{REF}$ and ground potential. The gates of each of the transistors 40, 42 and 44 are tied to the reference voltage. The stepped-down voltage $V_{SD}$ is applied to a node 45 at the source of the PMOS transistor 42, and the SENSE signal is produced at a node 47 defined by the drains of the PMOS transistor 42 and one of the NMOS transistors 44. The diode-configured transistor 40 maintains the voltage of node 45 a threshold drop below the reference voltage $V_{REF}$ in the absence of an overdriving magnitude of the stepped-down voltage $V_{SD}$. The PMOS transistor 42 is then turned off because its gate is at $V_{REF}$, and the NMOS transistors 44 pull down the SENSE signal to a logic low state. When, however, the magnitude of the stepped-down voltage $V_{SD}$ exceeds the reference voltage $V_{REF}$ by an amount equal to or greater than the threshold voltage of the PMOS transistor 42, the PMOS transistor turns on to pull up the SENSE signal to a logic high state. Thus, the sensing circuit 28a produces a SENSE signal having one or the other of two logic states, as a function of the relative values of the stepped-down and reference voltages.

The output circuit 30a includes an NMOS transistor 46, an inverter 48, and a NAND gate 50. An output enable signal, such as PWRUP*, is applied to the gate of the NMOS transistor 46 and the input of the inverter 48. The PWRUP* signal is a conventional signal generated in a memory device when the device is powered up and typically serves as an enable and/or reset signal for a number of circuits included within the memory device. The output of the inverter 48 is tied to a first of two inputs of the NAND gate 50. When the PWRUP* signal is asserted (i.e., a logic low state as conventionally indicated by the *), the first input of the NAND gate 50 is held high, and the NAND gate then acts as an inverter relative to its second input. The second input of the NAND gate 50 receives the SENSE signal and asserts or deasserts the supervoltage output signal SV* in response, respectively, to a logic high state or low state of the SENSE signal. The NMOS transistor 46 is tied between the second input of the NAND gate 50 and ground potential. The gate of the NMOS transistor 46 receives the PRWUP* signal. When PWRUP* is deasserted (i.e., a logic high state), the NMOS transistor 46 pulls the node 47 and the second input of the NAND gate 50 to ground potential, thereby deasserting SV*.

The selection circuit 32a includes a first NMOS transistor N1 which is connected in parallel with a first one, D1, of the diode-configured transistors 38 of the step-down circuit 26a. The select circuit 32a also includes a second NMOS transistor N2 which is coupled in parallel with the diode-configured transistor D1 and a second one, D2, of the diode-configured transistors 38. The gate of the transistor N1 receives a select signal SELECT1 to shunt the diode-configured transistor D1, thereby electrically disengaging it from the step-down circuit 26a. The gate of the transistor N2 receives a select signal SELECT2 to selectively shunt the diode-configured transistors D1 and D2, thereby electrically disengaging these transistors from the step-down circuit 26a. The select signals SELECT1 and SELECT2 may be produced internal to the integrated circuit incorporating the supervoltage circuit 12a, or may be externally applied to the integrated circuit.

The supervoltage circuit 12a shown in FIG. 3A is programmable to provide a three-way adjustment of the relative values of the step-down voltage $V_{SD}$ and the input voltage $V_{IN}$, depending on whether no select signal is asserted or one of the SELECT1 and the SELECT2 signals is asserted. By adjusting the relative values of the stepped-down voltage $V_{SD}$ and the input voltage $V_{IN}$, the required magnitude of the input voltage $V_{IN}$ necessary to cause assertion of the supervoltage output signal SV* is correspondingly adjusted.

Those skilled in the art will appreciate that transistors N1 and N2 function as electrically programmable fuses, and that any of a wide variety of programmable elements can be suitably adapted for such use. For example, one-time programmable elements, such as laser fuses and anti-fuses, can be used when repeat adjustability of the supervoltage circuit is not required or desired. Generally, any circuit element that is programmable to store (whether volatile or non-volatile) one of first and second programmable states can be suitably employed. Those skilled in the art will also appreciate that such programmable elements can be adapted to electrically engage the voltage drop elements to achieve the same effect as the above-described shunting or electrical disengagement.

One of the advantages achieved by the programmable supervoltage circuit 12a shown in FIG. 3A is best understood by reference to a third one, D0, of the diode-configured transistors 38 of the step-down circuit 26a. Because the drain of transistor D0 receives the full input voltage $V_{IN}$, this transistor experiences the greatest junction voltage between the drain and the semiconductor substrate in which the transistors 38 are formed. If, because of fabrication process variations, the threshold voltage of each of the transistors 38 is quite high, the transistors D1 and/or D2 can then be selectively electrically disengaged from the step-down circuit 26a. This reduces the input voltage $V_{IN}$ required to trip the sensing circuit 28a and avoids potential junction breakdown effects at transistor D0.

Even if process variations are not a significant factor, certain testing procedures require significant negative biasing of the semiconductor substrate, which increases transistor threshold voltage. Also, temperature variations associated with certain testing procedures can cause significant transistor threshold voltage shifts. The above-described adjustability of the step-down circuit 26a provides for asserting the supervoltage output signal SV* while avoiding potential transistor junction breakdown effects at transistor D0. On the other hand, if transistor threshold voltages are low (due to process variations, low temperature, or a less negatively biased substrate), the programmable step-down circuit 26a provides for avoiding erroneous assertion of the supervoltage output signal SV* by a non-elevated input voltage $V_{IN}$. Thus, the supervoltage circuit 12a has a trip point which is programmably adjustable to account for the determined threshold characteristic of the integrated circuit and/or the selected test procedure.

Figure 3B:
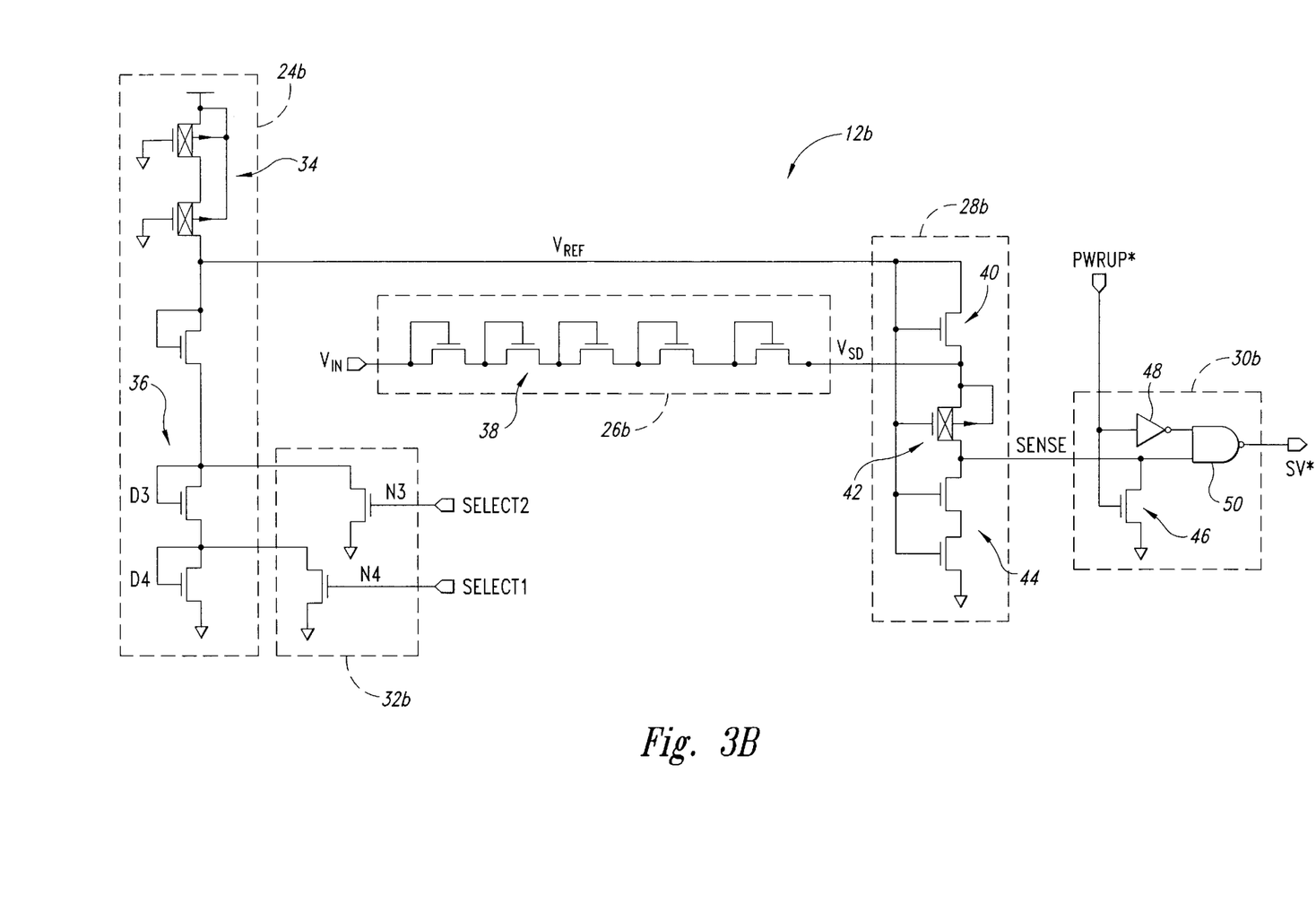
FIG. 3B is a schematic circuit diagram which depicts a preferred implementation of the supervoltage circuit shown in FIG. 2B.

FIG. 3B is a schematic diagram which depicts a preferred implementation of the supervoltage circuit 12b shown in FIG. 2B. The circuit elements shown in FIG. 3B are similar in type, configuration, and function to those corresponding circuit elements shown in FIG. 3A. However, instead of shunting elements for diode-configured transistors within the step-down circuit 26b, the supervoltage circuit 12b includes shunting transistors N3 and N4 which are coupled with first and second ones, D3 and D4, of the diode-configured NMOS transistors 36 in the reference circuit 24b. Application of the select signal SELECT1 or SELECT2 electrically bypasses transistor D4 or transistors D3 and D4, respectively. Correspondingly, the value of the reference voltage $V_{REF}$ is adjusted, and the required magnitude of the input voltage $V_{IN}$ necessary to trip the sensing circuit 28b is thereby adjusted. Those skilled in the art will appreciate that the programmability of the supervoltage circuit 12b can be combined with that of supervoltage circuit 12a (see FIG. 3A), providing a circuit in which either or both of the reference and step-down circuits can be adjusted.

Figure 3C:
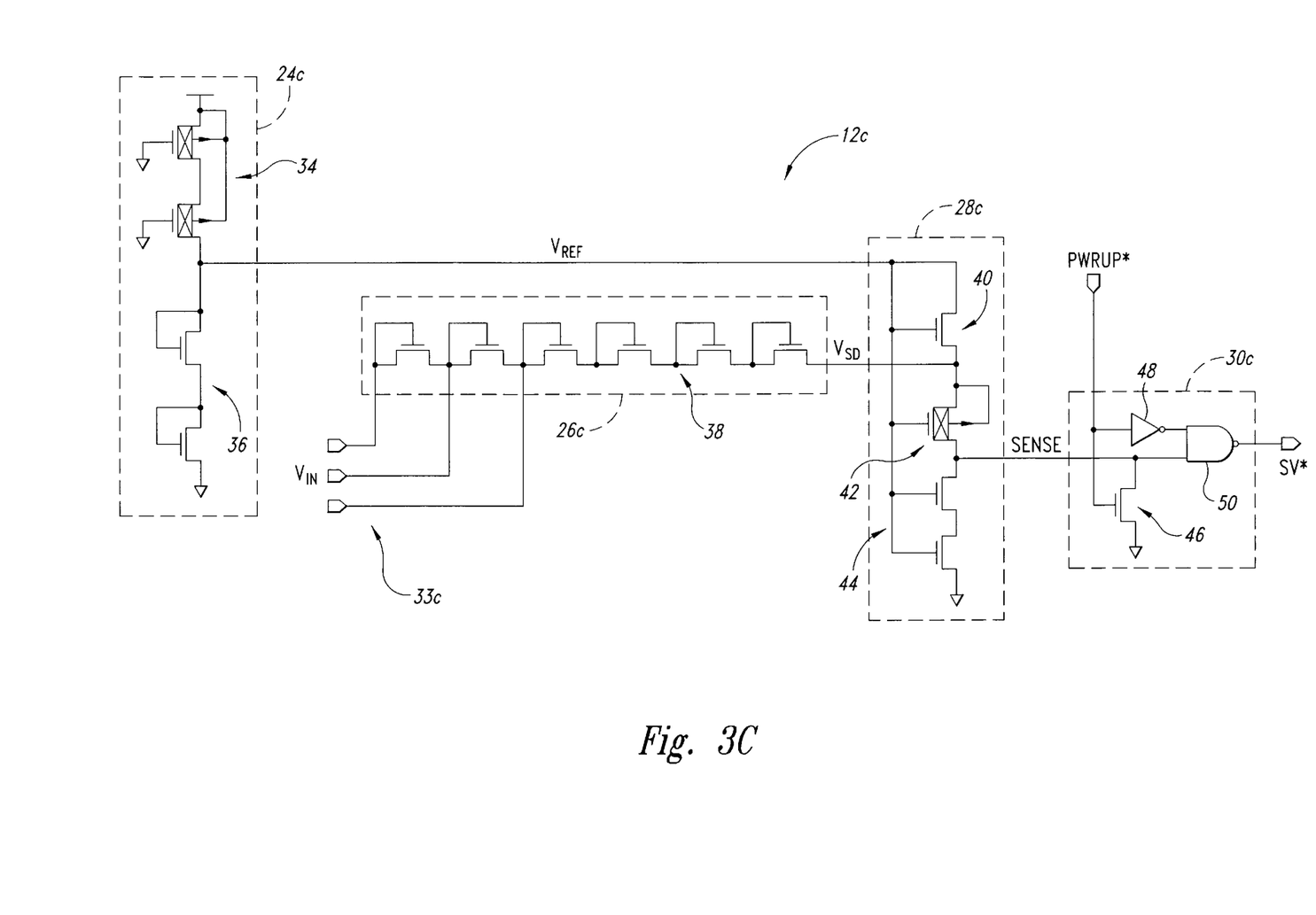
FIG. 3C is a schematic circuit diagram which depicts a preferred implementation of the supervoltage circuit shown in FIG. 2C.

FIG. 3C is a schematic diagram which depicts a preferred implementation of the supervoltage circuit 12c shown in FIG. 2C. The circuit elements shown in FIG. 3C are similar in type, configuration, and function to those corresponding circuit elements shown in FIGS. 3A and 3B. However, in place of shunting elements for electrically disengaging one or more circuit elements, the step-down circuit 26c has the plurality of inputs 33c adapted to receive the input voltage $V_{IN}$. Depending on threshold voltage characteristics and/or the particular type of testing intended, the input voltage $V_{IN}$ can be applied to a selected one of the inputs 33c, thereby providing adjustability of the input voltage required to assert the supervoltage output signal SV*.

Figure 4:
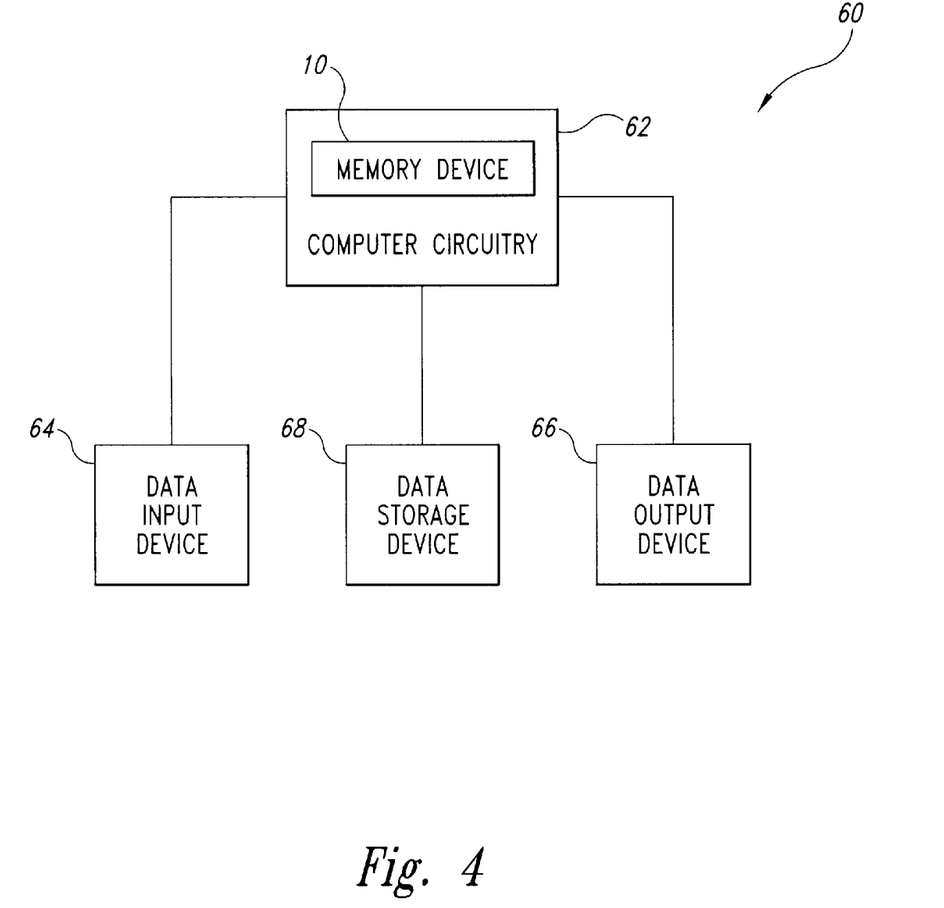
FIG. 4 is a functional block diagram which depicts a computer system having the memory device of FIG. 1.

FIG. 4 is a functional block diagram of a computer system 60 having the memory device 10 of FIG. 1. The computer system 60 includes computer circuitry 62 for such computer functions as executing software to perform desired calculations and tasks. The computer circuitry 62 typically includes a processor (not shown) and the memory device 10 as shown. One or more data input devices 64 is coupled to the computer circuitry 62 to allow an operator (not shown) to manually input data (including instructions) to the computer system 60. Examples of data input devices 64 include a keyboard and a pointing device. One or more data output devices 66 is coupled to the computer circuitry 62 to provide data to the operator. Examples of data output devices 66 include a printer and a video display unit. One or more data storage devices 68 is coupled to the computer circuitry 62 to store data and/or retrieve data from external storage media (not shown). Examples of storage devices 68 and associated storage media include drives that accept floppy and hard disks, magnetic tape recorders, and compact-disk read-only memory (CD-ROM) readers.

It will be appreciated that, although embodiments of the invention have been described above for purposes of illustration, various modifications may be made without deviating from the spirit and scope of the invention. All or most of the functions of one or more of the functional blocks shown in FIGS. 1 and 2A–2C can be integrated in or more of the other functional blocks. For example, the functions of the test enable circuit can be integrated within the test circuit, or the functions of the selection circuit can be integrated within the step-down or reference circuits. The step-down circuit can even be eliminated, if the reference circuit is adapted to generate a suitable voltage, and the selection circuit functions can then be integrated within the reference or sensing circuits. Indeed, numerous variations are well within the scope of the invention. Accordingly, the invention is not limited except as by the appended claims.

I claim:

1. An integrated circuit, comprising:

a primary circuit;

a test circuit coupled with the primary circuit and operable to test primary circuit functions in response to a test enable signal; and a test enable circuit coupled with the test circuit and adapted to receive an input voltage, the test enable circuit operable to assert the test enable signal in response to the input voltage exceeding a trip point magnitude, the test enable circuit being programmable to adjust the trip point magnitude, the test enable circuit further including a voltage drop element operable to reduce the input voltage, and a shunting element coupled with and operable to electrically bypass the voltage drop element.

2. The integrated circuit of claim 1 wherein the test enable circuit includes a programmable element having first and second programmable states, the test enable circuit being programmable to provide the trip point magnitude of first and second magnitudes corresponding to the respective one of the first and second programmable states of the programmable element.

3. The integrated circuit of claim 2 wherein the programmable element is an electric fuse.

4. The integrated circuit of claim 3 wherein the electric fuse is a transistor.

5. The integrated circuit of claim 1 wherein the voltage drop element is a diode-configured transistor.

6. The integrated circuit of claim 1 wherein the shunting element is a transistor.

7. A supervoltage circuit, comprising:

a reference circuit operable to produce a reference voltage;

a step-down circuit adapted to receive an input voltage and to produce a stepped-down voltage in response thereto;

a sensing circuit coupled with the reference and step-down circuits and operable to receive the reference and the stepped-down voltages and to produce a sense signal as a function of the relative values thereof;

wherein the magnitude of the input voltage required to assert the sense signal is adjustable; and a selection circuit coupled with the step-down circuit and adapted to receive a selection signal and to responsively adjust the value of the stepped-down voltage relative to the input voltage to correspondingly adjust the magnitude of the input voltage required to assert the sense signal.

8. The supervoltage circuit of claim 7, further comprising a selection circuit coupled with the reference circuit and adapted to receive a selection signal and to responsively adjust the value of the reference voltage to correspondingly adjust the magnitude of the input voltage required to assert the sense signal.

9. The supervoltage circuit of claim 7 wherein the step-down circuit receives the input voltage at one of a plurality of input terminals, the relative values of the input and stepped-down voltages corresponding thereto, to correspondingly adjust the magnitude of the input voltage required to assert the sense signal.

10. A supervoltage circuit, comprising:

a reference circuit operable to produce a reference voltage;

a step-down circuit adapted to receive an input voltage and to produce a stepped-down voltage in response thereto;

a sensing circuit coupled with the reference and step-down circuits and operable to receive the reference and the stepped-down voltages and to produce a sense signal as a function of the relative values thereof; and a selection circuit coupled with the step-down circuit and adapted to receive a selection signal and to responsively adjust the value of the stepped-down voltage relative to the input voltage.

11. The supervoltage circuit of claim 10 wherein the step-down circuit includes a plurality of voltage drop elements operable to reduce the input voltage to produce the stepped-down voltage, and wherein the selection circuit is operable to electrically engage or disengage one of the voltage drop elements in response to the selection signal.

12. The supervoltage circuit of claim 10 wherein the step-down circuit includes a plurality of voltage drop elements operable to reduce the input voltage to produce the stepped-down voltage, and wherein the selection circuit includes a shunting element coupled with and operable to bypass one of the voltage drop elements.

13. The supervoltage circuit of claim 12 wherein each of the voltage drop elements is a diode-configured transistor.

14. The supervoltage circuit of claim 12 wherein the shunting element is a transistor.

15. A supervoltage circuit, comprising:

a reference circuit operable to produce a reference voltage;

a step-down circuit adapted to receive an input voltage and to produce a stepped-down voltage in response thereto;

a sensing circuit coupled with the reference and step-down circuits and operable to receive the reference and the stepped-down voltages and to produce a sense signal as a function of the relative values thereof; and a selection circuit coupled with the reference circuit and adapted to receive a selection signal and to responsively adjust the value of the reference voltage.

16. The supervoltage circuit of claim 15 wherein the reference circuit includes a plurality of voltage drop elements operable to provide an approximately constant voltage drop, and wherein the selection circuit is operable to electrically engage or disengage one of the voltage drop elements in response to the selection signal.

17. The supervoltage circuit of claim 15 wherein the reference circuit includes a plurality of voltage drop elements operable to provide an approximately constant voltage drop, and wherein the selection circuit includes a shunting element coupled with and operable to bypass one of the voltage drop elements.

18. The supervoltage circuit of claim 17 wherein each of the voltage drop elements is a diode-configured transistor.

19. The supervoltage circuit of claim 17 wherein the shunting element is a transistor.

20. A supervoltage circuit, comprising:
a reference circuit operable to produce a reference voltage;
a step-down circuit adapted to receive an input voltage and including a plurality of voltage drop elements operable to reduce the input voltage to produce a stepped-down voltage, the step-down circuit further including a shunting element coupled with and operable to electrically bypass selected ones of the voltage drop elements to adjust the relative values of the input and stepped-down voltages; and
a sensing circuit coupled with the reference and step-down circuits and operable to receive the reference and the stepped-down voltages and to produce a sense signal as a function of the relative values thereof.

21. The supervoltage circuit of claim 20 wherein each of the voltage drop elements is a diode-configured transistor.

22. The supervoltage circuit of claim 20 wherein the shunting element is an electrically programmable element.

23. The supervoltage circuit of claim 22 wherein the electrically programmable element is a transistor.

24. A memory device, comprising:
a memory cell array operable to store data;
an array access circuit coupled with the memory cell array and operable to read data from and write data to the memory cell array;
a test circuit coupled with the array access circuit and operable to test memory cell array and array access circuit functions in response to a test enable signal; and
a supervoltage circuit coupled with the test circuit and adapted to receive an input voltage, the supervoltage circuit operable to assert the test enable signal in response to the input voltage exceeding a trip point magnitude, the supervoltage circuit being programmable to adjust the trip point magnitude the supervoltage circuit comprising:
a reference circuit operable to produce a reference voltage;
a plurality of voltage drop elements operable to reduce the input voltage to produce a stepped-down voltage;
a programmable shunting element coupled with and operable to bypass one of the voltage drop elements to programmably adjust the value of the stepped-down voltage relative to the input voltage; and
a sensing circuit coupled with the reference circuit and the voltage drop elements and operable to receive the reference and the stepped-down voltages and to produce a sense signal as a function of the relative values thereof.

25. The memory device of claim 24 wherein the supervoltage circuit includes:
a reference circuit operable to produce a reference voltage;
a plurality of voltage drop elements operable to reduce the input voltage to produce a stepped-down voltage;
a programmable shunting element coupled with and operable to bypass one of the voltage drop elements to programmably adjust the value of the stepped-down voltage relative to the input voltage; and
a sensing circuit coupled with the reference circuit and the voltage drop elements and operable to receive the reference and the stepped-down voltages and to produce a sense signal as a function of the relative values thereof.

26. The memory device of claim 24 wherein the supervoltage circuit includes:
a step-down circuit operable to receive the input voltage and to produce a stepped-down voltage in response thereto;
a plurality of voltage drop elements operable to provide a reference voltage;
a programmable shunting element coupled with and operable to bypass one of the voltage drop elements to programmably adjust the value of the reference voltage; and
a sensing circuit coupled with the step-down circuit and the voltage drop elements and operable to receive the stepped-down voltage and reference voltages and to produce a sense signal as a function of the relative values thereof.

27. The memory device of claim 24 wherein the supervoltage circuit is adapted to receive the input voltage at one of a plurality of input terminals, and wherein the supervoltage circuit includes:
a reference circuit operable to produce a reference voltage;
a plurality of voltage drop elements operable to reduce the input voltage to produce a stepped-down voltage, selected ones of the voltage drop elements being electrically disengaged corresponding to the one of the input terminals receiving the input voltage; and
a sensing circuit coupled with the reference circuit and the voltage drop elements and operable to receive the reference and the stepped-down voltages and to produce a sense signal as a function of the relative values thereof.

28. In an integrated circuit having test circuitry for testing integrated circuit functions, a method of enabling the test circuitry, comprising the steps of:
determining a threshold voltage characteristic of the integrated circuit;
programming the test circuitry corresponding to the determined threshold voltage characteristic by selecting a number of discrete voltage drops corresponding to the determined threshold voltage characteristic, the number of discrete voltage drops being selected by electrically engaging selected circuit elements;
applying an input voltage to the test circuitry, the input voltage having a magnitude selected corresponding to the determined threshold voltage characteristic; and
enabling the test circuitry in response to applying the input voltage of the selected magnitude.

29. The method of claim 28, further comprising the step of selecting one of a plurality of test procedures for testing integrated circuit functions, and wherein the step of applying an input voltage to the test circuitry includes the step of applying the input voltage of a magnitude selected corresponding to the selected test procedure.

30. The method of claim 28, further comprising the step of reducing the input voltage.

31. In an integrated circuit having test circuitry for testing integrated circuit functions, a method of enabling the test circuitry, comprising the steps of:

determining a threshold voltage characteristic of the integrated circuit;

programming the test circuitry corresponding to the determined threshold voltage characteristic by selecting a number of discrete voltage drops corresponding to the determined threshold voltage characteristic, the number of discrete voltage drops being selected by electrically disengaging selected circuit elements;

applying an input voltage to the test circuitry, the input voltage having a magnitude selected corresponding to the determined threshold voltage characteristic; and     enabling the test circuitry in response to applying the input voltage of the selected magnitude.

32. The method of claim 31 wherein the step of electrically disengaging selected circuit elements includes the step of electrically bypassing the selected circuit elements.

33. The method of claim 32 wherein the step of electrically bypassing the selected circuit elements includes the step of shunting the selected circuit elements.

34. In an integrated circuit having a supervoltage circuit for enabling test circuitry to test integrated circuit functions, a method of adjusting a supervoltage value, comprising the steps of:

determining a threshold voltage characteristic of the integrated circuit;

selecting one of a plurality of test procedures;

receiving an input voltage; and reducing the input voltage to produce a stepped-down voltage, the relative values of the input and stepped-down voltages being determined corresponding to the determined threshold voltage characteristic and the selected test procedure, the input voltage being reduced by selecting a number of discrete voltage drops corresponding to the determined threshold voltage characteristic and the selected test procedure, the number of discrete voltage drops being selected by electrically bypassing selected circuit elements.

35. The method of claim 34 wherein the step of electrically bypassing selected circuit elements includes the step of shunting the selected circuit elements.

36. In an integrated circuit having a supervoltage circuit for enabling test circuitry to test integrated circuit functions, a method of adjusting a supervoltage value, comprising the steps of:

determining a threshold voltage characteristic of the integrated circuit;

producing a reference voltage;

receiving an input voltage and then reducing the input voltage by selecting a number of discrete voltage drops corresponding to the determined threshold voltage characteristic, the number of discrete voltage drops being selected by electrically bypassing selected circuit elements; and     producing a test enable signal as a function of the reference voltage and the input voltage corresponding to the determined threshold voltage characteristic.

37. The method of claim 36 wherein the step of producing a reference voltage includes the step of selecting a number of discrete voltage drops corresponding to the determined threshold voltage characteristic.

38. The method of claim 37 wherein the step of selecting a number of discrete voltage drops includes the step of electrically engaging selected circuit elements.

39. The method of claim 36 wherein the step of electrically bypassing selected circuit elements includes the step of shunting the selected circuit elements.

40. In an integrated circuit having a supervoltage circuit for enabling test circuitry to test integrated circuit functions, a method of adjusting a supervoltage value, comprising the steps of:

determining a threshold voltage characteristic of the integrated circuit;

selecting one of a plurality of test procedures; and selecting a number of discrete voltage drops corresponding to the determined threshold voltage characteristic and the selected test procedure, the number of discrete voltage drops being selected by electrically bypassing selected circuit elements.

41. The method of claim 40 wherein the step of electrically bypassing selected circuit elements includes the step of shunting the selected circuit elements.

42. The method of claim 40, further comprising the step of producing a reference voltage corresponding to the selected number of discrete voltage drops.

43. The method of claim 40, further comprising the steps of:

receiving an input voltage; and reducing the input voltage corresponding to the selected number of discrete voltage drops.

* * * * *